US008268287B2

(12) United States Patent
Ting et al.

(10) Patent No.: US 8,268,287 B2
(45) Date of Patent: Sep. 18, 2012

(54) ZINC OXIDE NANOROD THIN FILM AND METHOD FOR MAKING SAME

(75) Inventors: Chu-Chi Ting, Chiayi County (TW); Chang-Hung Li, Chiayi County (TW); Chih-You Kuo, Chiayi County (TW); Hsiang-Chen Wang, Chiayi County (TW)

(73) Assignee: National Chung Cheng University, Chiayi County (TW)

( * ) Notice: Subject to any disclaimer, the term of this patent is extended or adjusted under 35 U.S.C. 154(b) by 231 days.

(21) Appl. No.: 12/778,755

(22) Filed: May 12, 2010

(65) Prior Publication Data

US 2011/0280796 A1    Nov. 17, 2011

(51) Int. Cl.
  *C01G 9/02*    (2006.01)
(52) U.S. Cl. .................... 423/622; 977/762
(58) Field of Classification Search .................. 423/622; 977/746
  See application file for complete search history.

(56) References Cited

OTHER PUBLICATIONS

Suguman et al. "Zinc oxide nanowires in chemical bath on seeded substrates: Role of hexamine" J Sol-Gel Sci Techn (2006) 39:49-56 DOI 10.1007/s10971-006-6969-y.*
Chu-Chi Ting, Chang-Hung Li, Chih-You Kuo, Chia-Chen Hsu, Hsiang-Chen Wang, Ming-Hsun Yang, Compact and vertically-aligned ZnO nanorod thin films by the low-temperature solution method, Thin Solid Films, vol. 518, Issue 15, May 31, 2010, pp. 4156-4162, ISSN 0040-6090, 10.1016/j.tsf.2009.11.082. Available online Dec. 3, 2009.*
The growth mechanism and optical properties of ultralong ZnO nanorod arrays with a high aspect ratio by a preheating hydrothermal method Jijun Qiu et al 2009 Nanotechnology 20 155603.*

* cited by examiner

*Primary Examiner* — Daniel C McCracken
*Assistant Examiner* — Richard M Rump
(74) *Attorney, Agent, or Firm* — WPAT, P.C.; Anthony King

(57) ABSTRACT

The zinc oxide nanorod thin film in accordance with the present invention is highly condensed and has ideal photo-electric properties. The method for making the zinc oxide nanorod thin film has two steps: forming a zinc oxide seed layer comprising multiple crystals each having a grain size of 1-100 nm on a basal plate and preparing a zinc oxide nanorod thin film growing solution in which the zinc oxide seed layer is allowed to grow a zinc oxide crystal columnar layer at a growing temperature ranging from 50 to 100° C. for a growing time ranging from 0.5 to 10 hours to form a zinc oxide nanorod thin film, wherein the zinc oxide nanorod thin film growing solution is a 0.001-0.1 M aqueous zinc ion solution comprising hexamethylenetetramine.

4 Claims, 26 Drawing Sheets

ZINC OXIDE NANOROD THIN FILM AND METHOD FOR MAKING SAME

BACKGROUND OF THE INVENTION

1. Field of the Invention

The present invention relates to a zinc oxide nanorod thin film and a method for making the zinc oxide nanorod thin film.

2. Description of the Prior Art

Zinc oxide is a direct-bandgap semiconductor having ideal photoelectric properties, including a bandgap of 3.37 eV at room temperature with significant exciton binding energy (60 meV) and high refractive index (n=2.01 for 550 nm). Therefore, zinc oxide may be widely used in making light-emitting diodes (LED) and solar cells.

Conventional methods for making the zinc oxide nanorod thin film are complex and expensive. These conventional methods include: chemical vapor deposition, laser ablation, sputtering and sol-gel spin coating. Practicing such methods requires a vacuum and high-temperature, which is extremely expensive and unfavorably raises costs. Thus seeking a non-vacuum, low-temperature, low-cost and simple method is highly relevant.

Vayssieres et al. has proposed a conventional low-temperature solution growing method (J. Phys. Chem. B 2001, 105, 3350) for making zinc oxide nanorod thin films. However, a zinc oxide nanorod thin film made with the conventional method proposed by Vayssieres et al. has many holes left unfilled between hexagonal prismatic zinc oxide nanorods of which the zinc oxide nanorod thin film is made.

In additional to the aforementioned conventional low-temperature solution growing method, Tak et al. disclosed physical properties of zinc oxide nanorod thin films made with conventional methods (J. Phys. Chem. B 2005, 109, 19263). According to the prior art, through altering growing factors, such as, pH of growing solution, growing temperature, properties of a seed layer, or zinc ion concentration, proportionate changes are made to properties of the zinc oxide nanorod thin film. However, simply altering growing factors does not provide a highly condensed zinc oxide nanorod thin film of ideal photoelectric properties having a packing density over 0.84.

A conventional method for making a nanorod thin film disclosed in U.S. published application no. 2007/0220713 A1 also fails to provide a highly condensed nanorod thin film, so establishing a long-felt and unsolved need for highly condensed zinc oxide nanorod thin film of ideal photoelectric properties.

It is significant that the prior art fails to provide a highly condensed zinc oxide nanorod thin film of ideal photoelectric properties due to various problems, especially, existence of unfilled holes between nanorods. To overcome the shortcomings, the present invention provides a zinc oxide nanorod thin film and a method to make the same to mitigate or obviate the aforementioned problems.

SUMMARY OF THE INVENTION

The main objective of the invention is to provide a highly condensed zinc oxide nanorod thin film of ideal photoelectric properties and a method to make the zinc oxide nanorod thin film.

The zinc oxide nanorod thin film in accordance with the present invention has a light transmittance greater than 85% and a packing density over 0.84. The zinc oxide nanorod is also highly condensed and has ideal photoelectric properties.

The method for making the zinc oxide nanorod thin film in accordance with the present invention has two steps: forming a zinc oxide seed layer comprising multiple crystals having grain sizes of 1-100 nm on a basal plate and preparing a zinc oxide nanorod thin film growing solution in which the zinc oxide seed layer is allowed to grow a zinc oxide crystal columnar layer at a growing temperature ranging from 50 to 100° C. for a growing time ranging from 0.5 to 10 hours to form a zinc oxide nanorod thin film, wherein the zinc oxide nanorod thin film growing solution is a 0.001-0.1 M aqueous zinc ion solution comprising hexamethylenetetramine.

The above described method is capable of making the desired zinc oxide nanorod thin film based on a low-temperature solution growing method of controlled growing temperature, concentration and growing time.

Other objectives, advantages and novel features of the invention will become more apparent from the following detailed description when taken in conjunction with the accompanying drawings.

DETAILED DESCRIPTION OF THE PREFERRED EMBODIMENTS

The method in accordance with the present invention for making a highly condensed zinc oxide nanorod thin film of ideal photoelectric properties is based on a low-temperature solution growing method proposed by Vayssieres et al., wherein specific factors such as concentration, temperature and time are modified.

A zinc oxide nanorod thin film made with the above method has multiple fused hexagonal prismatic zinc oxide nanorodsand is thus highly condensed. It is observed that fewer holes are generated between the zinc oxide nanorodsof the zinc oxide nanorod thin film in accordance with the present invention. The zinc oxide nanorod thin film also has ideal optical properties. For example, a zinc oxide nanorod thin film made with a zinc oxide seed layer allowed to grow for 6 hours has a thickness of 800 nm, a visible-light transmittance of 85%, refractive index of 1.74 and packing density of 0.84.

The method in accordance with the present invention comprises a zinc oxide seed layer preparing step and a zinc oxide crystal columnar layer-preparing step.

EXAMPLE 1

Example 1 demonstrates an embodiment of the present invention using sol-gel method to prepare a zinc oxide seed layer.

1. Preparation of a Zinc Oxide Seed Layer Sol-Gel Solution 2-methoxyethanol (2-MOE, $HOC_2H_4OCH_3$), monoethanolamine (MEA, $HOC_2H_4NH_2$) and zinc ion source are mixed to create an admixed solution with a molar ratio of zinc ion ($Zn^{2+}$), 2-methoxyethanol and monoethanolamine of 1:10-40:1. The zinc ion source is preferred to be zinc acetate ($Zn(CH_3COO)_2$). The admixed solution is then stirred for 10 hours to form a zinc oxide seed layer sol-gel solution. The zinc ion may be provided as zinc acetate, zinc bromide, zinc chloride, zinc fluoride, zinc iodide, zinc sulfide, zinc sulfate and zinc nitrate or a combination thereof.

2. Preparation of a Zinc Oxide Seed Layer.

The zinc oxide seed layer sol-gel solution is spin-applied to a basal plate that may be glass soft baked on a 100° C. heating plate for 10 minutes, sintered at 200° C. for 10 minutes and then annealed at 200-800° C. to form a zinc oxide seed layer. Alternatively, the basal plate may be made of quartz, single crystal silicon, polycrystalline silicon, sapphire, polyethylene terephthalate (PET), acrylate or polyimide.

The zinc oxide seed layer obtained in the current embodiment is formed from crystals each having a grain size of about 5-100 nm and a thickness of about 20-90 nm.

Another feasible embodiment using the aforementioned sol-gel method allows the zinc oxide seed layer to be annealed at 400° C., which results in a zinc oxide seed layer formed from crystals each having a grain size of about 20 nm.

Figure 1:
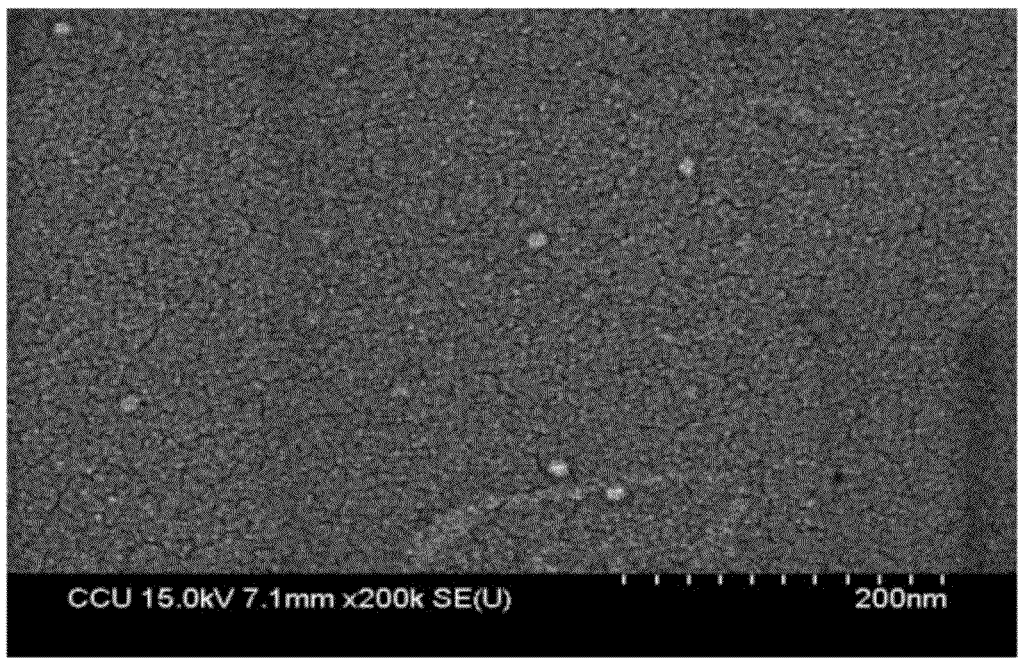
FIG. 1 is a top view of a zinc oxide seed layer prepared with a sol-gel method and sintered at 200° C. in accordance with the present invention.
Figure 2:
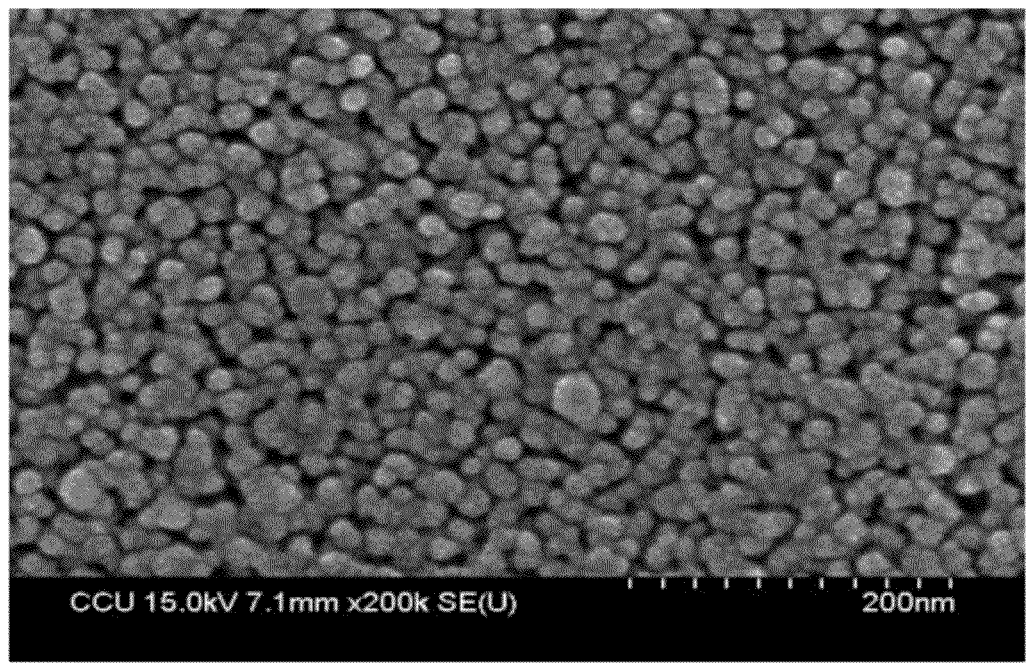
FIG. 2 is a top view of a zinc oxide seed layer prepared with a sol-gel method and sintered at 400° C. in accordance with the present invention.
Figure 3:
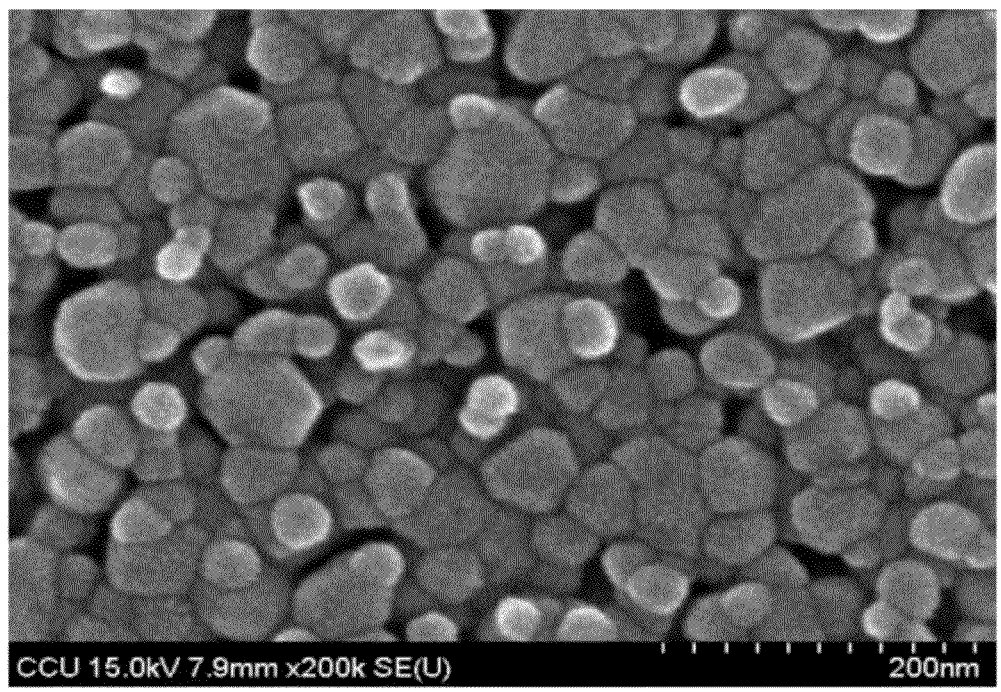
FIG. 3 is a top view of a zinc oxide seed layer prepared with a sol-gel method and sintered at 600° C. in accordance with the present invention.
Figure 4:
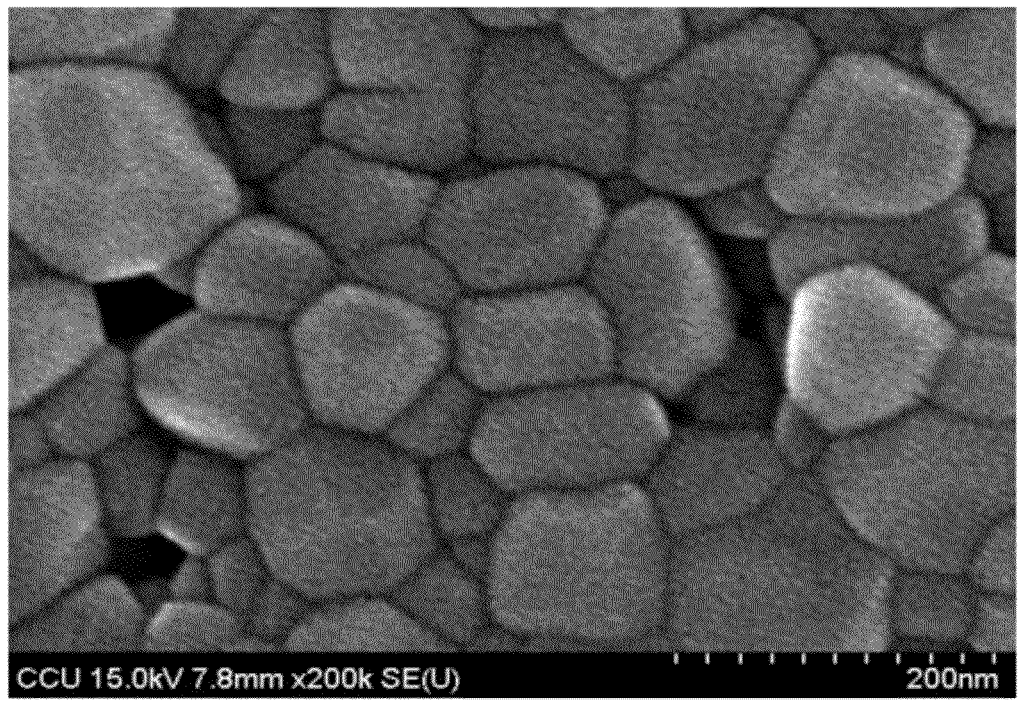
FIG. 4 is a top view of a zinc oxide seed layer prepared with a sol-gel method and sintered at 600° C. in accordance with the present invention.

With reference to FIGS. 1 to 3, a zinc oxide seed layer having an even surface and formed from crystals each having a grain size of 1-100 nm is used to make a highly condensed zinc oxide nanorod thin film. A zinc oxide seed layer formed from crystals larger than 100 nm leads to unaligned zinc oxide nanorods and thus fail to generate a highly condensed zinc oxide nanorod thin film. With reference to FIG. 4, when annealed at 800° C., crystals are sized at about 100-150 nm.

Zinc oxide nanorods grown from a zinc oxide seed layer formed from crystals each having a grain size of 100-150 nm are disordered and fail to form a highly condensed zinc oxide nanorod thin film.

EXAMPLE 2

Example 2 demonstrates an embodiment of the present invention using a sputtering method to prepare a zinc oxide seed layer formed on a basal plate from crystals each having a grain size of 5-100 nm.

Sputtering is widely known to skilled artisans in the field of the present invention. Thus detail routines of sputtering are hereby omitted. Relevant factors regarding the present invention for practicing a sputtering method to make the embodiment of Example 2 are:

- material of the basal plate: the basal plate may be made from a solid inorganic substance selected from the group consisting of glass, quartz, single crystal silicon polycrystalline silicon and sapphire, or from a soft organic substances selected from a group consisting of polyethylene terephthalate, acrylate and polyimide;
- temperature of the basal plate: ranging from room temperature to 600° C.;
- oxygen flow rate: 30 sccm;
- argon flow rate: 8 sccm;
- background pressure: $5 \times 10^{-6}$ torr;
- working pressure: 15 mtorr;
- RF power: 150 W; and
- sputtering time: 5 minutes.

Figure 5:
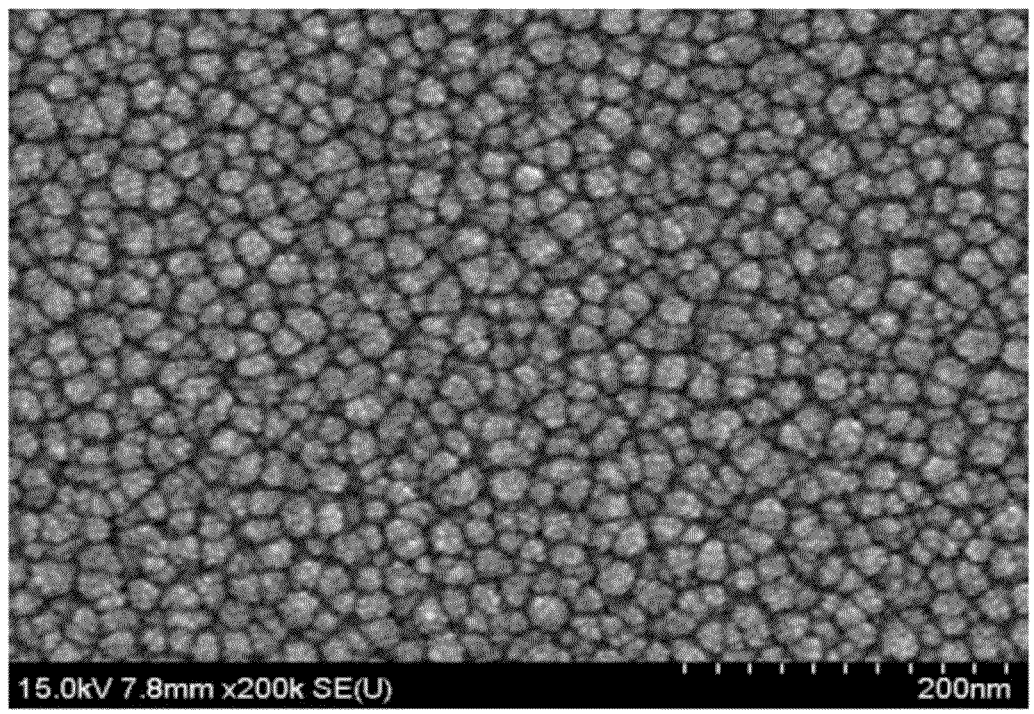
FIG. 5 is a top view of a zinc oxide seed layer prepared with a sputtering method in accordance with the present invention.
Figure 6:
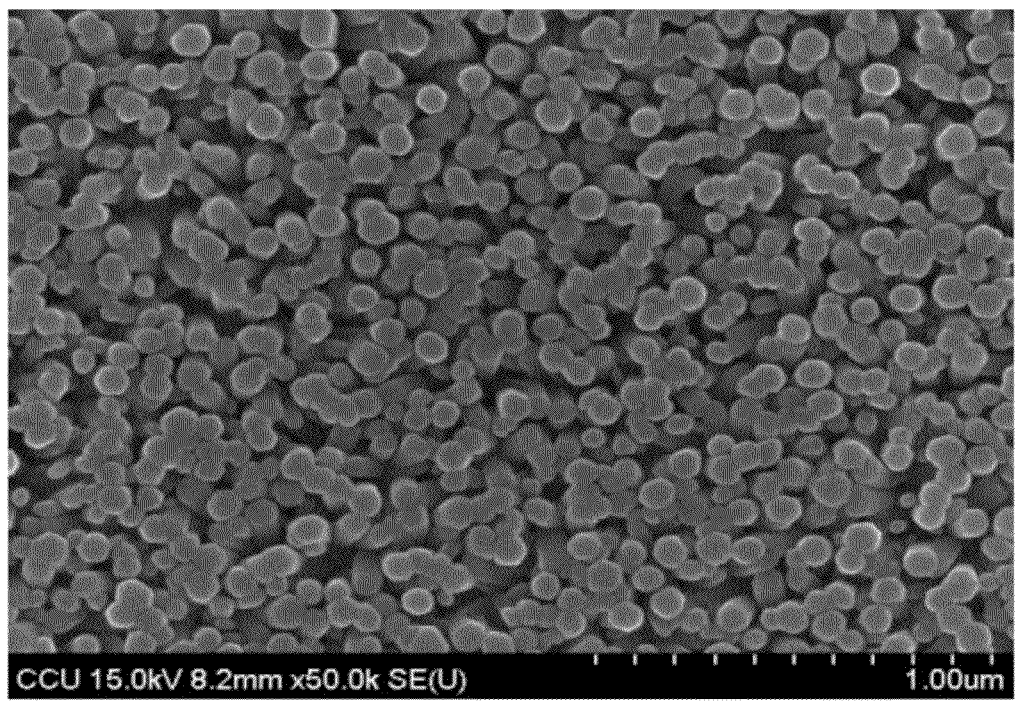
FIG. 6 is a top view of a zinc nanorod thin film made by allowing a zinc oxide seed layer formed from crystals each having a grain size of about 20 nm to grow in a multiple-stepwise process in a zinc oxide nanorod thin film growing solution having 0.05 M zinc ion at 75° C. for 1.5 hours.
Figure 7:
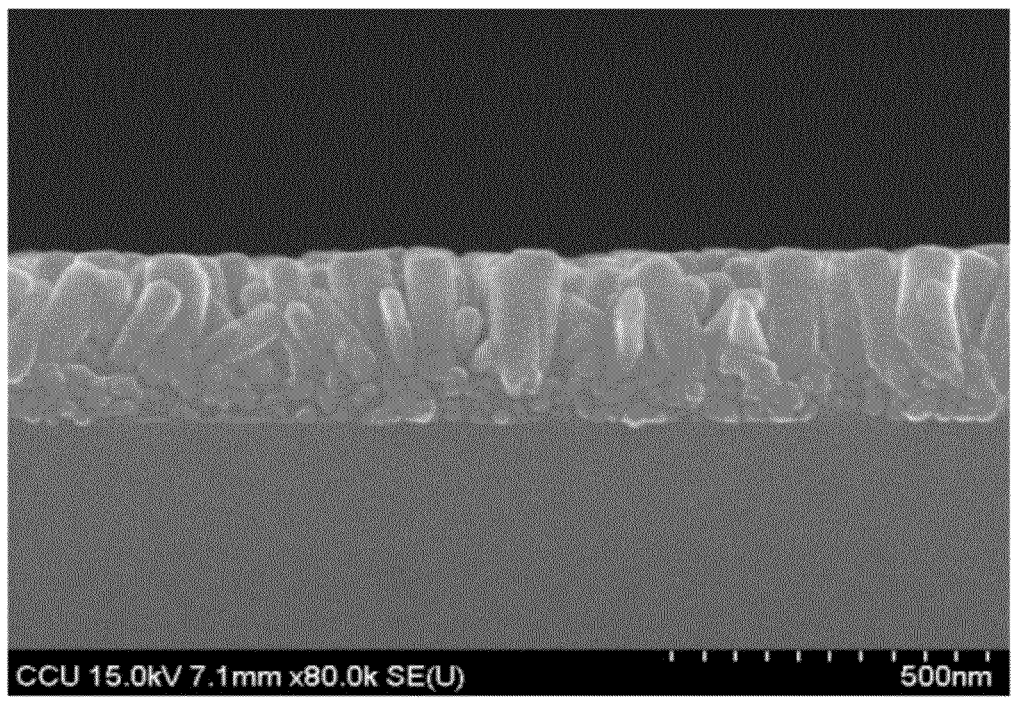
FIG. 7 is a side view of the zinc nanorod thin film in FIG. 6.

With reference to FIG. 5, a zinc oxide seed layer is made with a sputtering method under conditions defined with above listed factors. The zinc oxide seed layer is formed from crystals each having a grain size of about 5-100 nm.

Furthermore, another feasible embodiment of Example 2 maintains the basal plate at room temperature and produces a zinc oxide seed layer formed from crystals each having a grain size of about 20 nm.

As above mentioned in Example 1, a zinc oxide seed layer formed from crystals each having an exceedingly grain size has an uneven surface that leads to unaligned and randomly orientated zinc oxide nanorods, and thus leads to the failure to make a highly condensed zinc oxide nanorod thin film. A zinc oxide seed layer having a flat and even surface and formed from crystals each having a grain size of 1-100 nm is used to make a highly condensed zinc oxide nanorod thin film.

Example 1 and 2 demonstrates feasibility of making a zinc oxide seed layer with a sol-gel method or a sputtering method. Other than the aforementioned sol-gel method and sputtering method, a free dip coating method, a spraying method, an organic chemical vapor deposition method or a laser ablation method may also be employed to form a zinc oxide seed layer having a flat and even surface from crystals, wherein the each of the crystals has a grain size of 1-100 nm.

EXAMPLE 3

The zinc oxide nanorod thin film may be made by allowing the zinc oxide seed layer to grow in a multiple-stepwise process or in a one-step process. Example 3 demonstrates an embodiment allowing the zinc oxide seed layer to grow in a multiple-stepwise process.

1. Preparation of a Zinc Oxide Nanorod Thin Film Growing Solution

A zinc oxide nanorod thin film growing solution used to allow the zinc oxide seed layer to grow comprises zinc nitrate, hexamethylenetetraamine and deionized water, wherein concentration of zinc ion is 0.001-0.1 M and molar ratio of zinc ion, hexamethylenetetraamine and deionized water is 0.02-2:0.02-2:1000. The zinc ions may be provided by zinc nitrate, zinc bromide, zinc chloride, zinc fluoride, zinc iodide, zinc sulfide, zinc sulfate or zinc acetate or a combination thereof.

2. Preparation of a Zinc Oxide Crystal Columnar Layer at a Growing Temperature of 50-100° C. for a Growing Time of 0.5-10 Hours A multiple-stepwise process for making a zinc oxide crystal columnar layer at a growing temperature of 75° C. for a growing time of 6 hours is employed. A zinc oxide seed layer formed on a basal plate is allowed to grow in a zinc oxide nanorod thin film growing solution that is held at 75° C. for 1.5 hours, a quarter of the total growing time. The basal plate is then moved to a fresh preparation of zinc oxide nanorod thin film growing solution to grow at 75° C. for another 1.5 hours. The zinc oxide seed layer of the basal plate is allowed to grow in preparations of zinc oxide nanorod thin film growing solution for the growing time by sequentially growing in a preparation for a fraction of the growing time.

In this embodiment four preparations of zinc oxide nanorod thin film growing solution are prepared and the zinc oxide seed layer of the basal plate is allowed to grow for approximately 1.5 hours in each of the four preparations of zinc oxide nanorod thin film growing solution.

Another more specific embodiment uses a zinc oxide seed layer made with aforementioned sol-gel method or sputtering method so having crystal grain sized about at 20 nm. The zinc oxide seed layer is allowed to grow in a zinc oxide nanorod thin film growing solution having 0.05 M zinc ion at 75° C. for 6 hours to make a zinc oxide nanorod thin film.

A growing zinc oxide seed layer continuously consumes zinc ion in the zinc oxide nanorod thin film growing solution. When zinc ion concentration drops significantly, the nanorods growing from the zinc oxide seed layer tend to be orientated towards a c-axis, which prevents formation of a highly condensed nanorod thin film. The multiple-stepwise process keeps the zinc oxide seed layer growing at relatively constant zinc ion concentration so reduces orientation toward the c-axis.

EXAMPLE 4

Example 4 demonstrates an embodiment allowing the zinc oxide seed layer to grow in a one-step process.

1. Preparation of a Zinc Oxide Nanorod Thin Film Growing Solution

A zinc oxide nanorod thin film growing solution used to allow the zinc oxide seed layer to grow comprises zinc acetate, hexamethylenetetraamine and deionized water, wherein the concentration of zinc ion is 0.001-0.1 M and the molar ratio of zinc ion, hexamethylenetetraamine and deionized water is 0.02-2:0.02-2:1000. The zinc ion may be provided by zinc acetate, zinc bromide, zinc chloride, zinc fluoride, zinc iodide, zinc sulfide, zinc sulfate or zinc nitrate or a combination thereof.

2. Preparation of a Zinc Oxide Crystal Columnar Layer at a Growing Temperature of 50-100° C. for a Growing Time of 0.5-10 Hours The one-step process employed in Example 4 for making a zinc oxide crystal columnar layer is different from the process employed in Example 3. During the one-step process, the basal plate is placed in a single preparation of the zinc oxide nanorod thin film growing solution, so that the zinc oxide seed layer is allowed to grow therein for a growing time, for example, 6 hours. The aforementioned one-step process forms a zinc oxide columnar layer gradually on the zinc oxide seed layer. A zinc oxide nanorod thin film is obtained from the zinc oxide columnar layer. The growing time is from 1 to 10 hours, more preferably between 3 and 8 hours and most preferably 6 hours In a more specific embodiment, a zinc oxide seed layer formed from zinc oxide crystals each having a grain size of about 20 nm is formed with the aforementioned sol-gel method or sputtering method. The zinc oxide seed layer is allowed to grow in a zinc oxide nanorod thin film growing solution having 0.05 M zinc ion at 75° C. for 6 hours to make a zinc oxide nanorod thin film.

A zinc ion supplying device capable of monitoring and supplying zinc ion into the single preparation of the zinc oxide nanorod thin film growing solution may be employed to maintain the zinc ion concentration thereof. The zinc ion supplying device may be a monitoring and supplying machine that approximately maintain the molar ratio of zinc ion of the zinc oxide nanorod thin film growing solution.

EXAMPLE 5

In Example 5, properties of embodiments of zinc oxide nanorod thin films made with the method in accordance with the present invention is examined, which demonstrates special effects provided by the zinc oxide nanorod thin films in accordance with the present invention.

Figure 8:
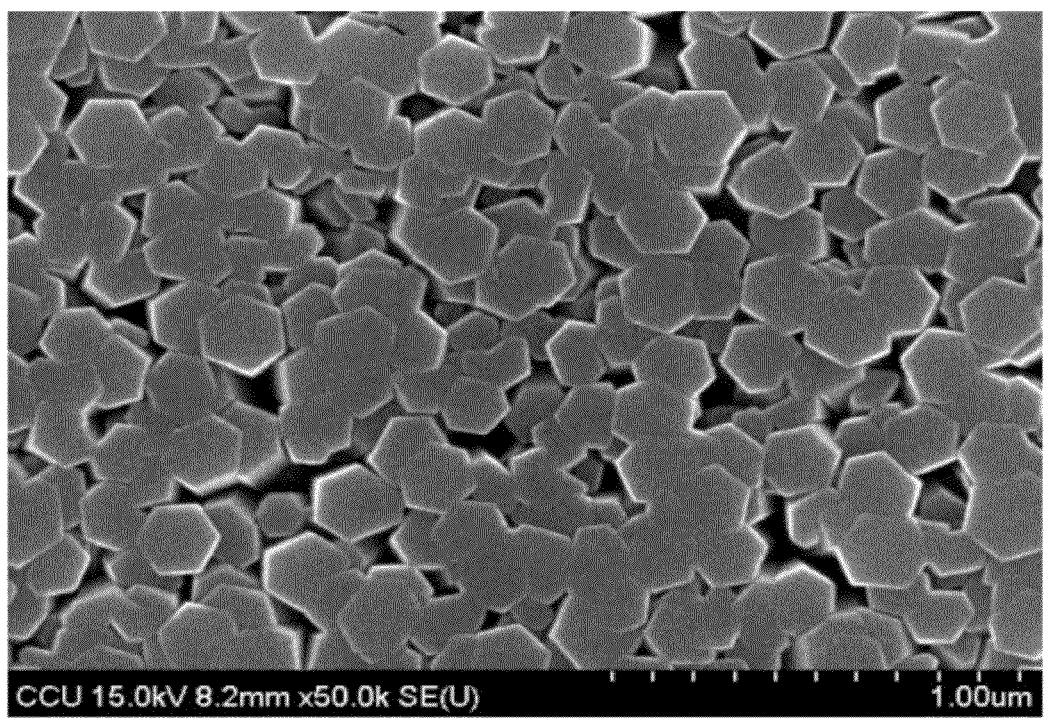
FIG. 8 is a top view of a zinc nanorod thin film made by allowing a zinc oxide seed layer formed from crystals each having a grain size of about 20 nm to grow in a multiple-stepwise process in a zinc oxide nanorod thin film growing solution having 0.05 M zinc ion at 75° C. for 6 hours.
Figure 9:
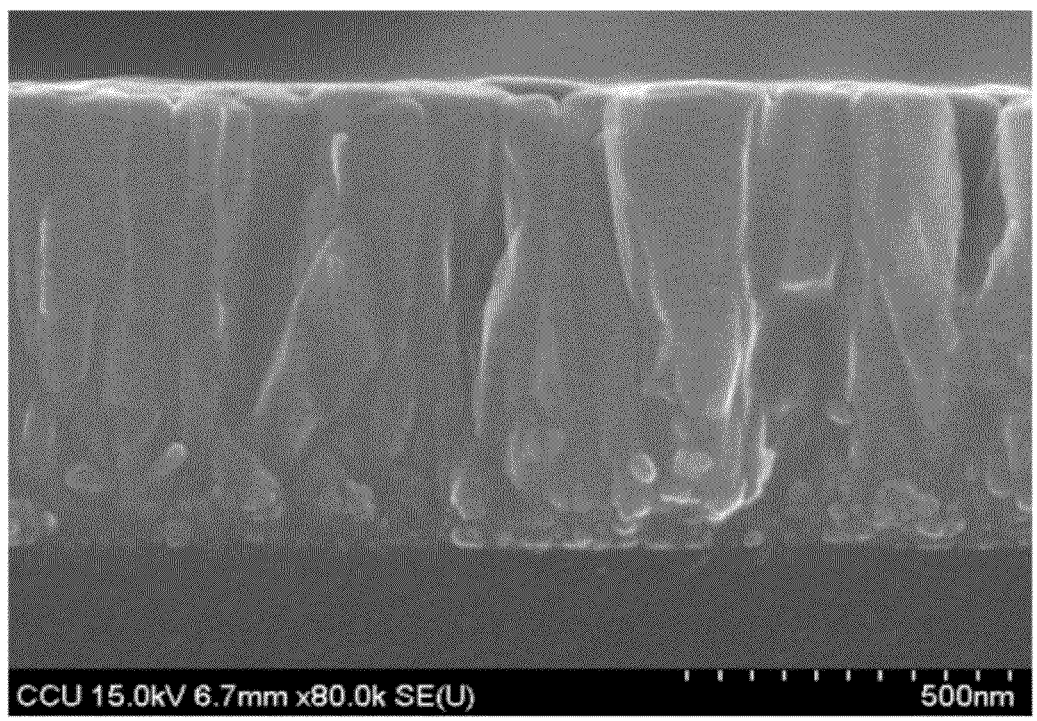
FIG. 9 is a side view of the zinc nanorod thin film in FIG. 8.
Figure 10:
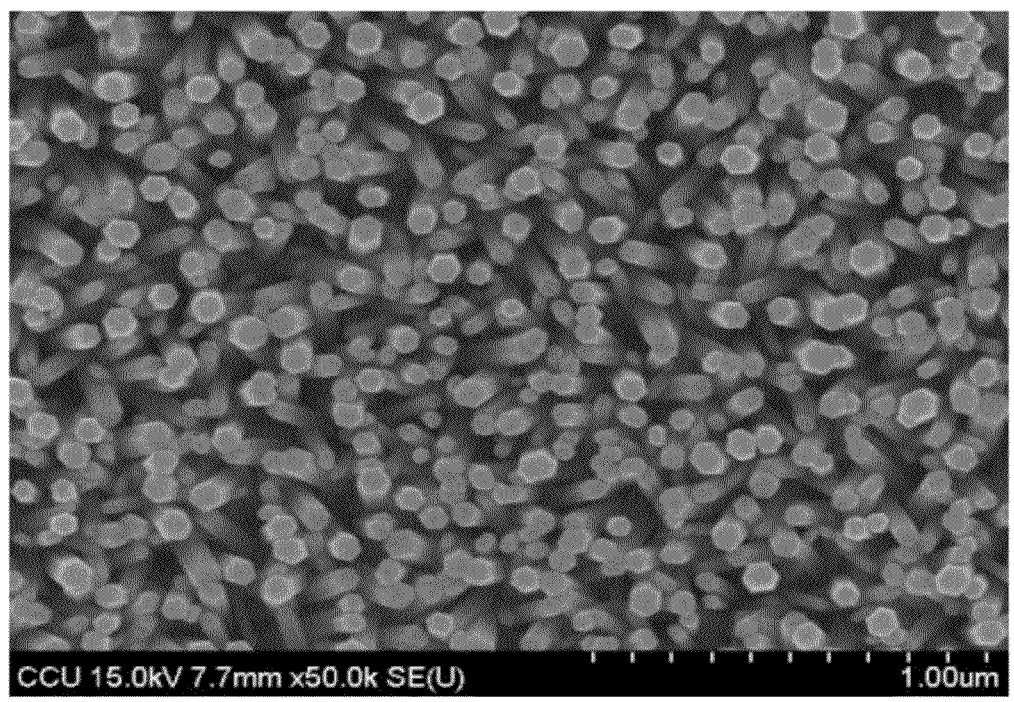
FIG. 10 is a top view of a zinc nanorod thin film made allowing a zinc oxide seed layer formed from crystals each having a grain size of about 20 nm to grow in a multiple-stepwise process in a zinc oxide nanorod thin film growing solution having 0.05 M zinc ion at 95° C. for 1.5 hours.
Figure 11:
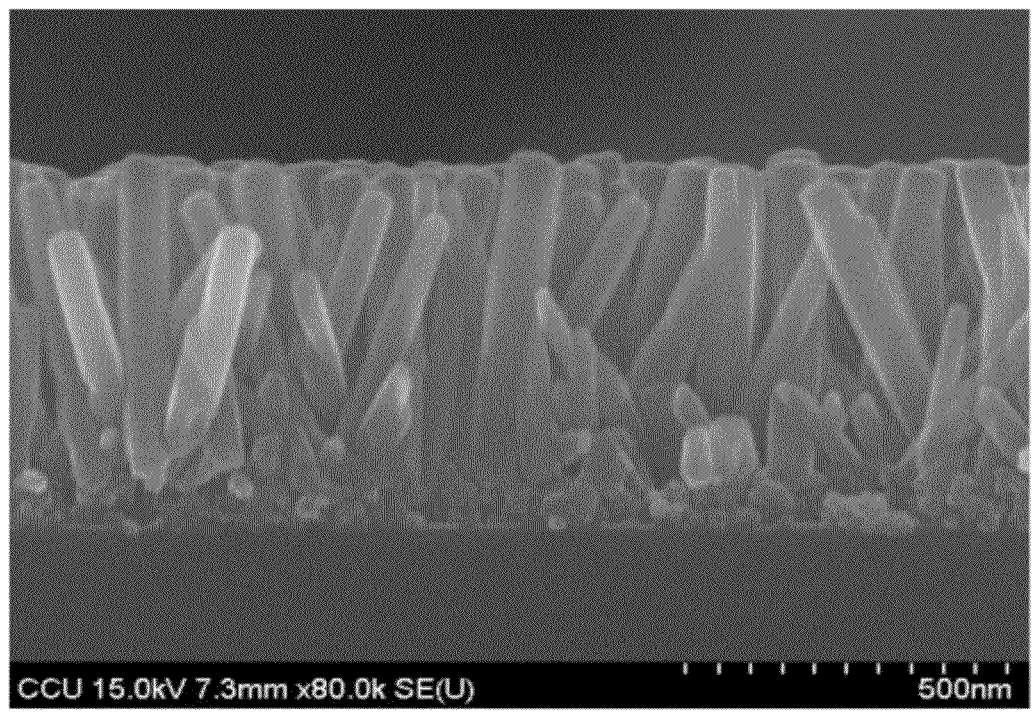
FIG. 11 is a side view of the zinc nanorod thin film in FIG. 10.
Figure 12:
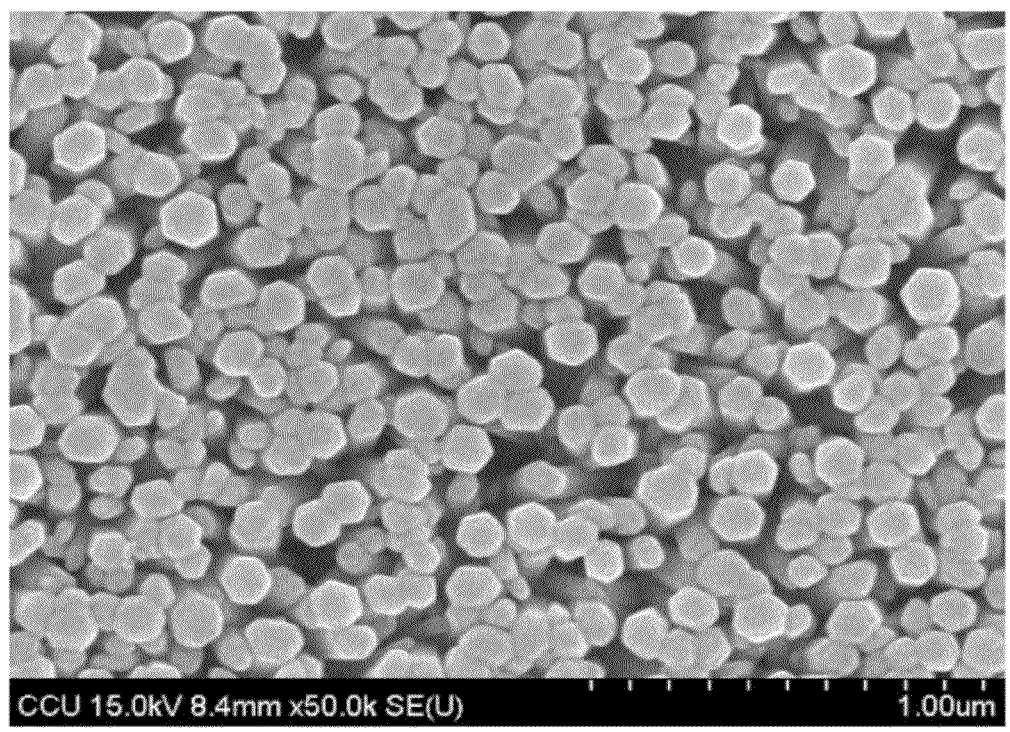
FIG. 12 is a top view of a zinc nanorod thin film made by allowing a zinc oxide seed layer formed from crystals each having a grain size of about 20 nm to grow in a multiple-stepwise process in a zinc oxide nanorod thin film growing solution having 0.05 M zinc ion at 75° C. for 4.5 hours.
Figure 13:
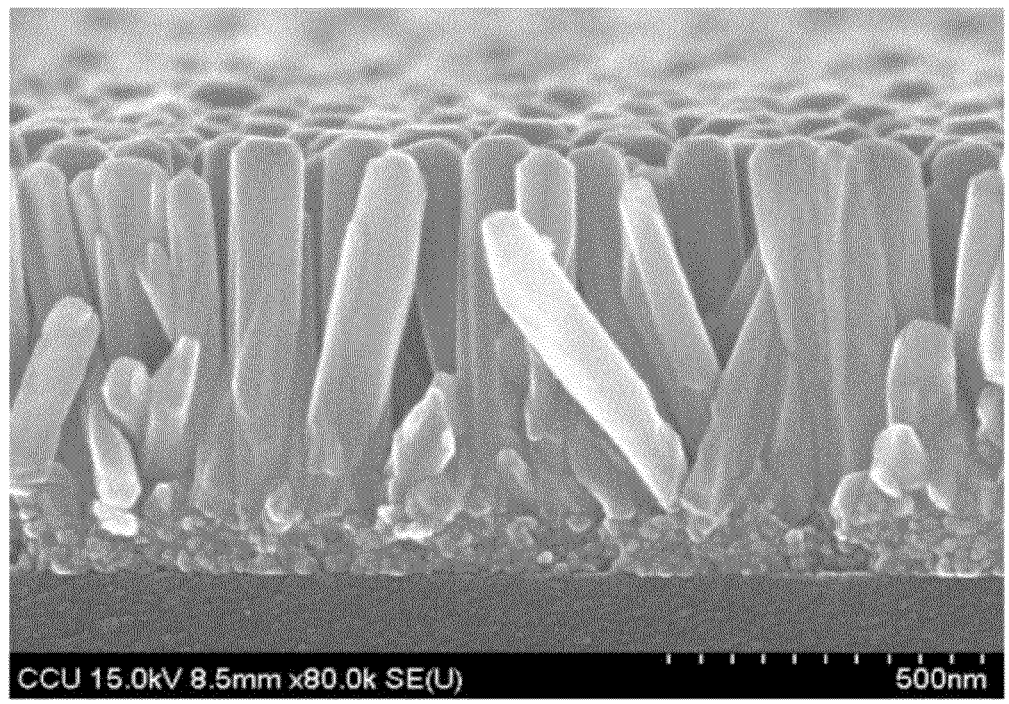
FIG. 13 is a side view of the zinc nanorod thin film in FIG. 12.
Figure 14:
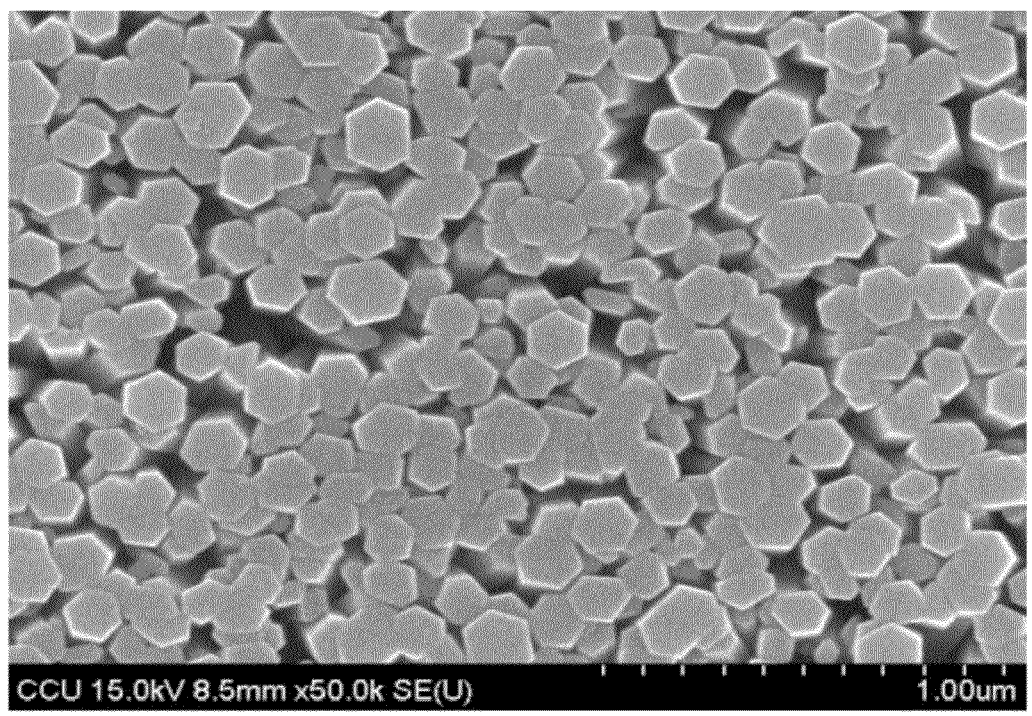
FIG. 14 is a top view of a zinc nanorod thin film made by allowing a zinc oxide seed layer formed from crystals each having a grain size of about 20 nm to grow in a one-step process in a zinc oxide nanorod thin film growing solution having 0.05 M zinc ion at 75° C. for 6 hours.
Figure 15:
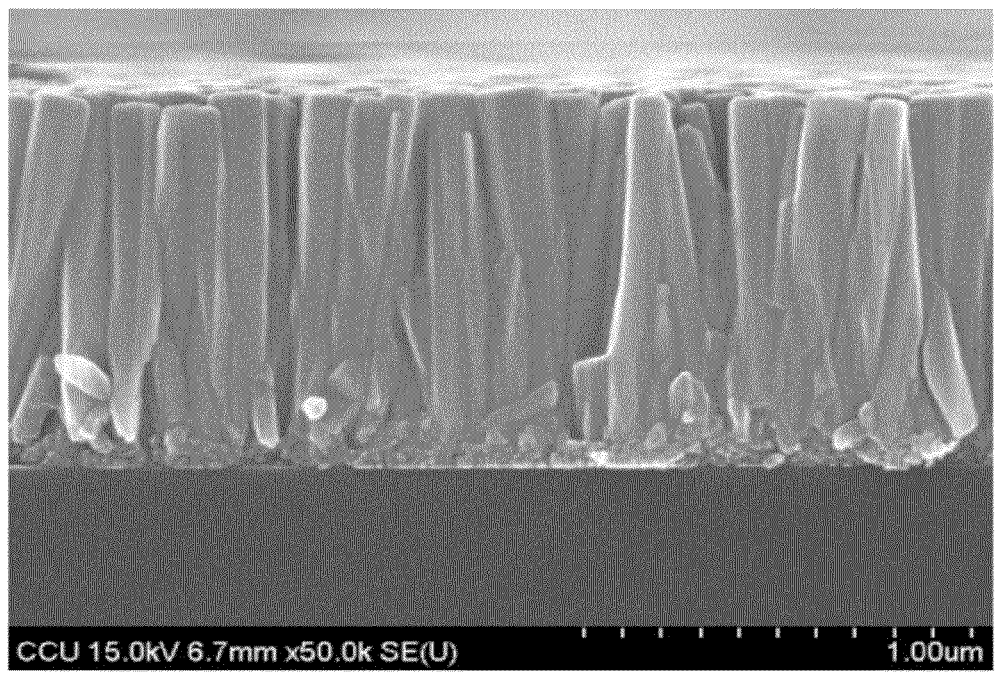
FIG. 15 is a side view of the zinc nanorod thin film in FIG. 14.
Figure 16:
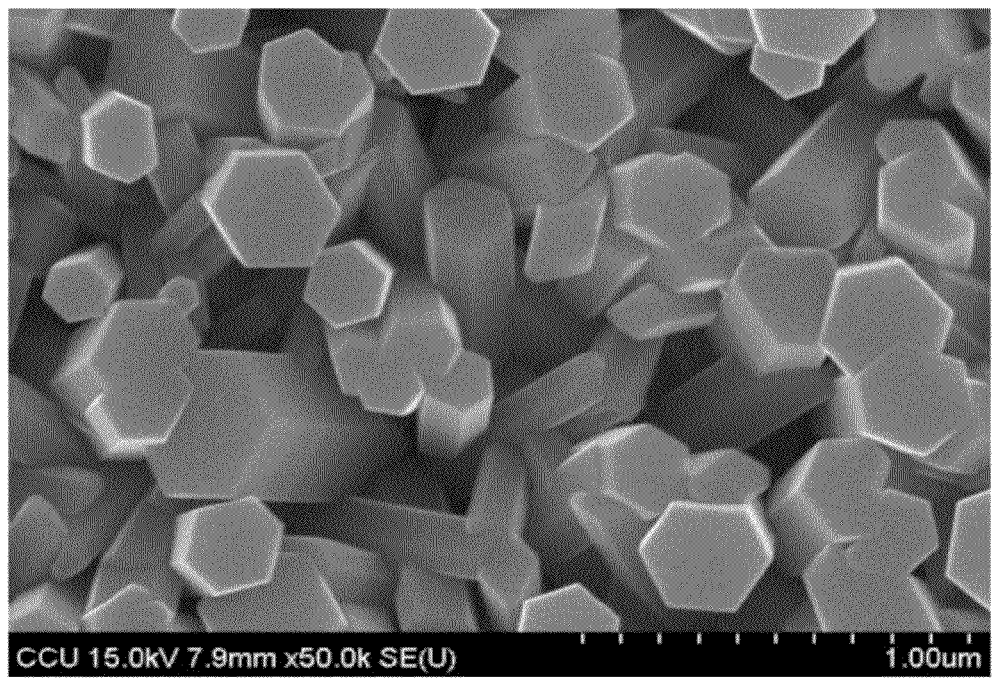
FIG. 16 is a top view of a zinc nanorod thin film made by allowing a zinc oxide seed layer formed from crystals each having a grain size of about 100 nm to grow in a one-step process in a zinc oxide nanorod thin film growing solution having 0.05 M zinc ion at 75° C. for 6 hours.
Figure 17:
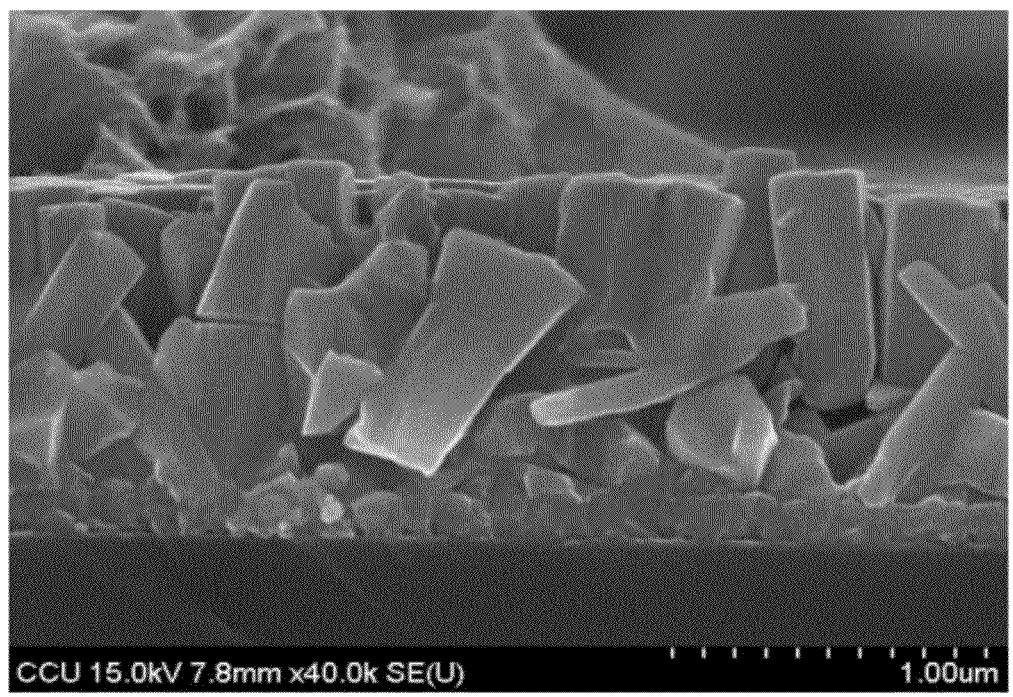
FIG. 17 is a side view of the zinc nanorod thin film in FIG. 16.
Figure 18:
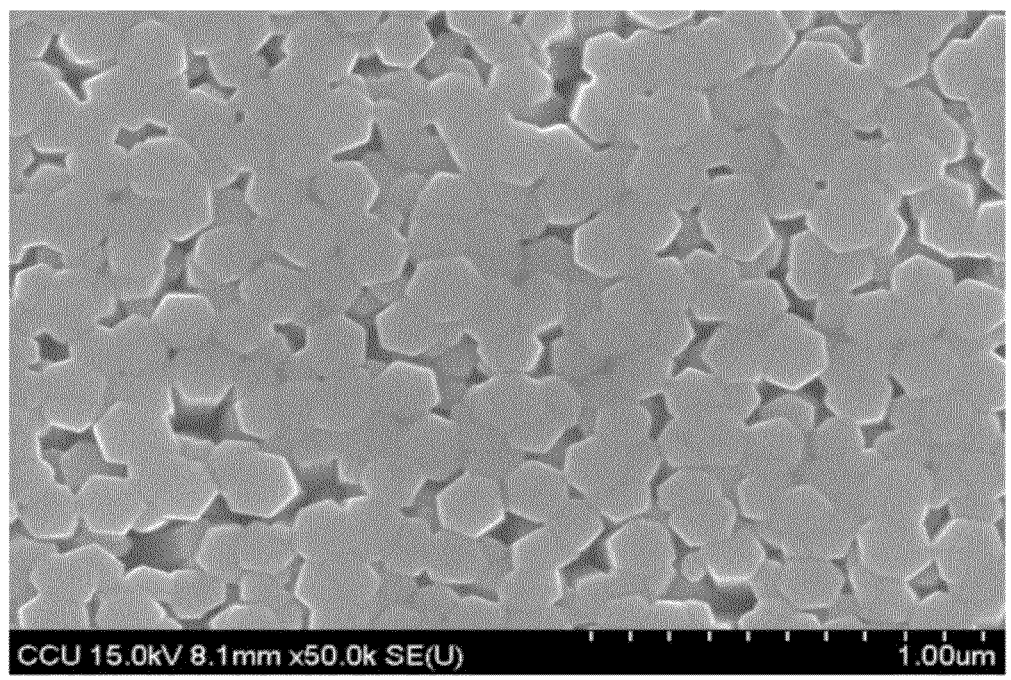
FIG. 18 is a top view of a zinc nanorod thin film made by allowing a sputtered zinc oxide seed layer formed from crystals each having a grain size of about 20 nm to grow in a multiple-stepwise process in a zinc oxide nanorod thin film growing solution having 0.05 M zinc ion at 75° C. for 6 hours.
Figure 19:
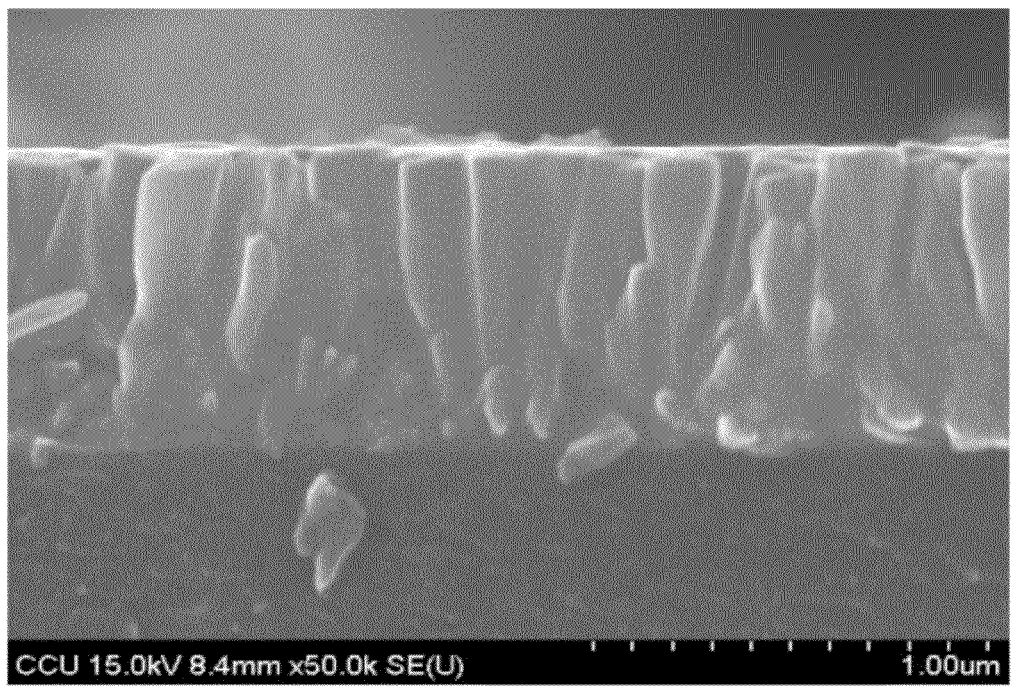
FIG. 19 is a side view of the zinc nanorod thin film in FIG. 18.

With reference to FIGS. 6-17, zinc oxide nanorod thin films are observed with a scanning electronic microscope (SEM). It is identified that zinc oxide nanorod thin films made with a zinc oxide seed layer formed from crystals each having a grain size of about 20 nm and allowed to grow in a zinc oxide nanorod thin film growing solution under conditions mentioned above. With reference to FIGS. 8 and 9, for example, zinc oxide nanorod thin films made with a zinc oxide seed layer allowed to grow at 75° C. for 6 hours with a multiple-stepwise process demonstrate significantly high density.

With reference to FIG. 3, a zinc oxide nanorod thin film is observed with an SEM. The zinc oxide nanorod thin film is made with a zinc oxide seed layer, wherein the zinc oxide seed layer is formed with a sputtering method from crystals each having a grain size of about 20 nm. With reference to FIGS. 8 and 9, a zinc oxide nanorod thin film is observed with an SEM. The zinc oxide nanorod thin film is made with a zinc oxide seed layer, wherein the zinc oxide seed layer is formed with a sol-gel method from crystals each having a grain size of about 20 nm. The zinc oxide nanorod thin films made with the zinc oxide seed layers made with the sputtering method or the sol-gel method demonstrate similarly condensed columnar seed particles.

With reference to FIGS. 8, 9, 18 and 19, zinc oxide nanorod thin films made with a zinc oxide seed layer formed from crystals each having a grain size of about 20 nm and allowed to grow at 75° C. for 6 hours with a multiple-stepwise process are observed with an SEM. The nanorods of the zinc oxide nanorod thin films have larger diameters and shorter lengths than that of zinc oxide nanorod thin films made under conventional conditions. It is clear that conditions allowing nanorods to radially grow thick, which raises packing density of a nanorod thin film, are favored for making highly condensed nanorod thin films.

Figure 20:
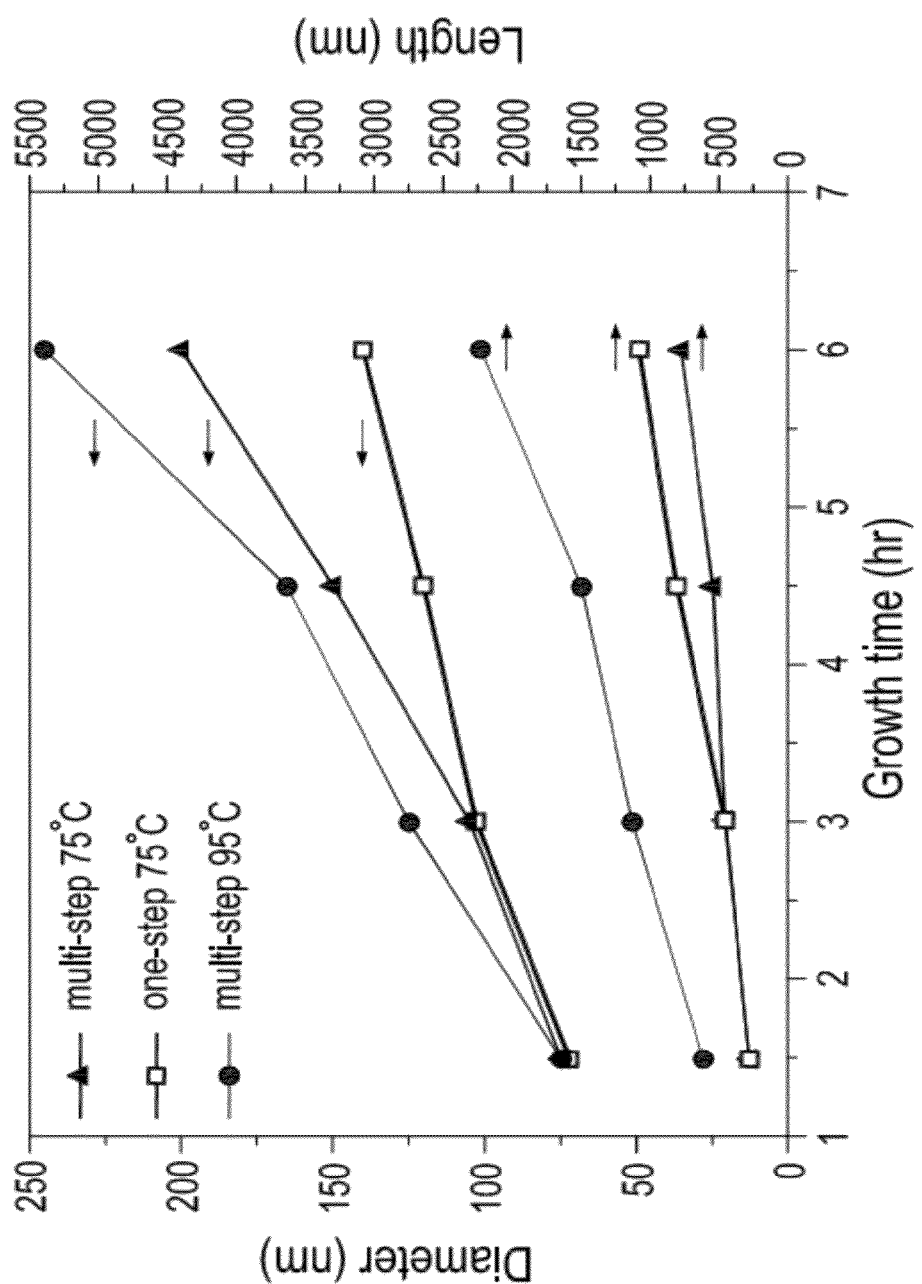
FIG. 20 is a graph indicating relationship between average diameter and average length of zinc oxide nanorods of a zinc oxide nanorod thin film in accordance with the present invention and growing temperature and growing time, wherein the zinc oxide nanorod thin film is grown from a zinc oxide seed layer formed from crystals each having a grain size of about 20 nm in a zinc oxide nanorod thin film growing solution having 0.05 M zinc ion.

With reference to FIG. 20, making zinc oxide seed layers with a one-step process or with a multiple-stepwise process is a factor of the diameter and length of nanorods. It is identified that nanorods made with a one-step process have smaller diameter and larger length than nanorods made with a multiple-stepwise process.

Figure 21:
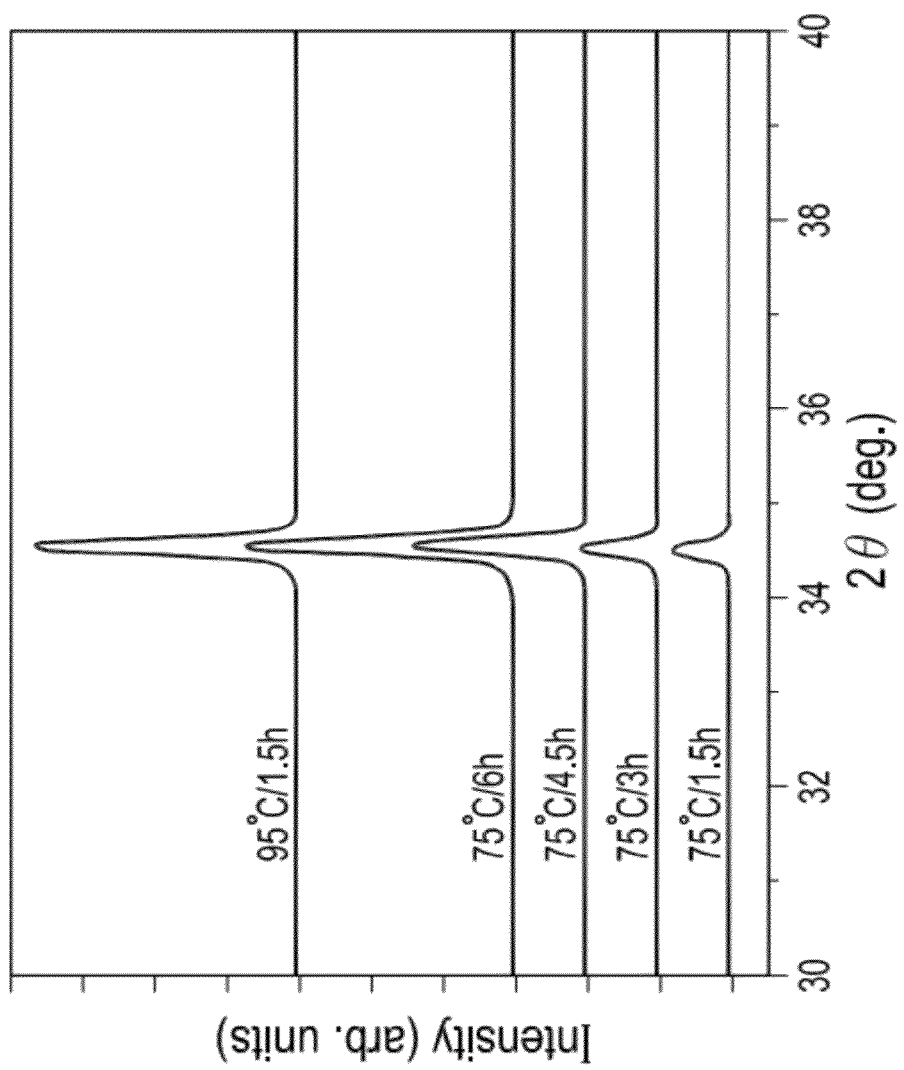
FIG. 21 is an intensity-versus-scattering angle XRD graph indicating relationships between average diameter and average length of zinc oxide nanorods of the zinc oxide nanorod thin film in accordance with the present invention and growing temperature and growing time, wherein a zinc oxide nanorod thin film is grown from a zinc oxide seed layer formed from crystals each having a grain size of about 20 nm in a zinc oxide nanorod thin film growing solution having 0.05 M zinc ion.

With reference to FIG. 21, XRD analysis on the zinc oxide nanorod thin film in accordance with the present invention indicates significant c-axis orientation optimization.

Figure 22:
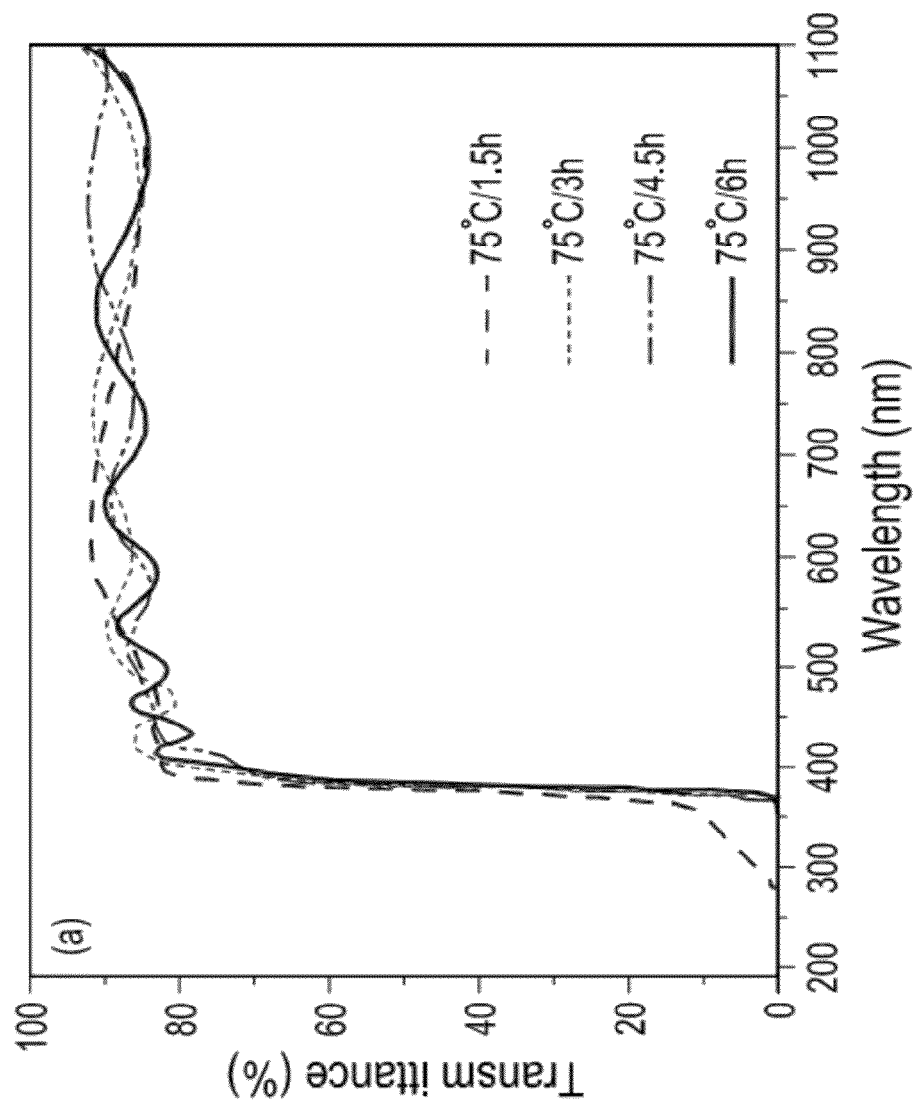
FIG. 22 is a transmittance-versus-wavelength graph of a zinc oxide nanorod thin film in accordance with the present invention made by allowing a zinc oxide seed layer formed from crystals each having a grain sized of about 20 nm to grow in a multiple-stepwise process in a zinc oxide nanorod thin film growing solution having 0.05 M zinc ion at 75° C. for 1.5-6 hours.
Figure 23:
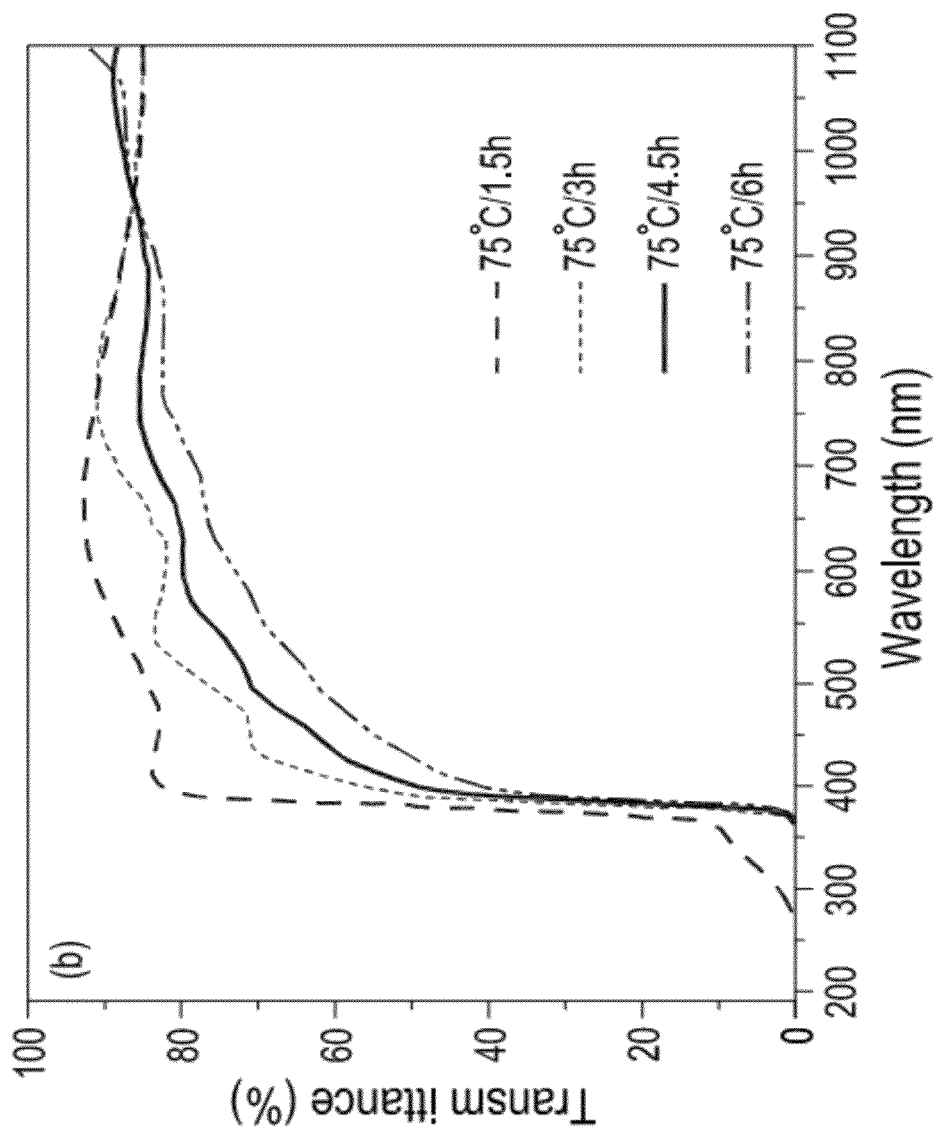
FIG. 23 is a transmittance-versus-wavelength graph of a zinc oxide nanorod thin film in accordance with the present invention made by allowing a zinc oxide seed layer formed from crystals each having a grain size of about 20 nm to grow in a one-step process in a zinc oxide nanorod thin film growing solution having 0.05 M zinc ion at 75° C. for 1.5-6 hours.
Figure 24:
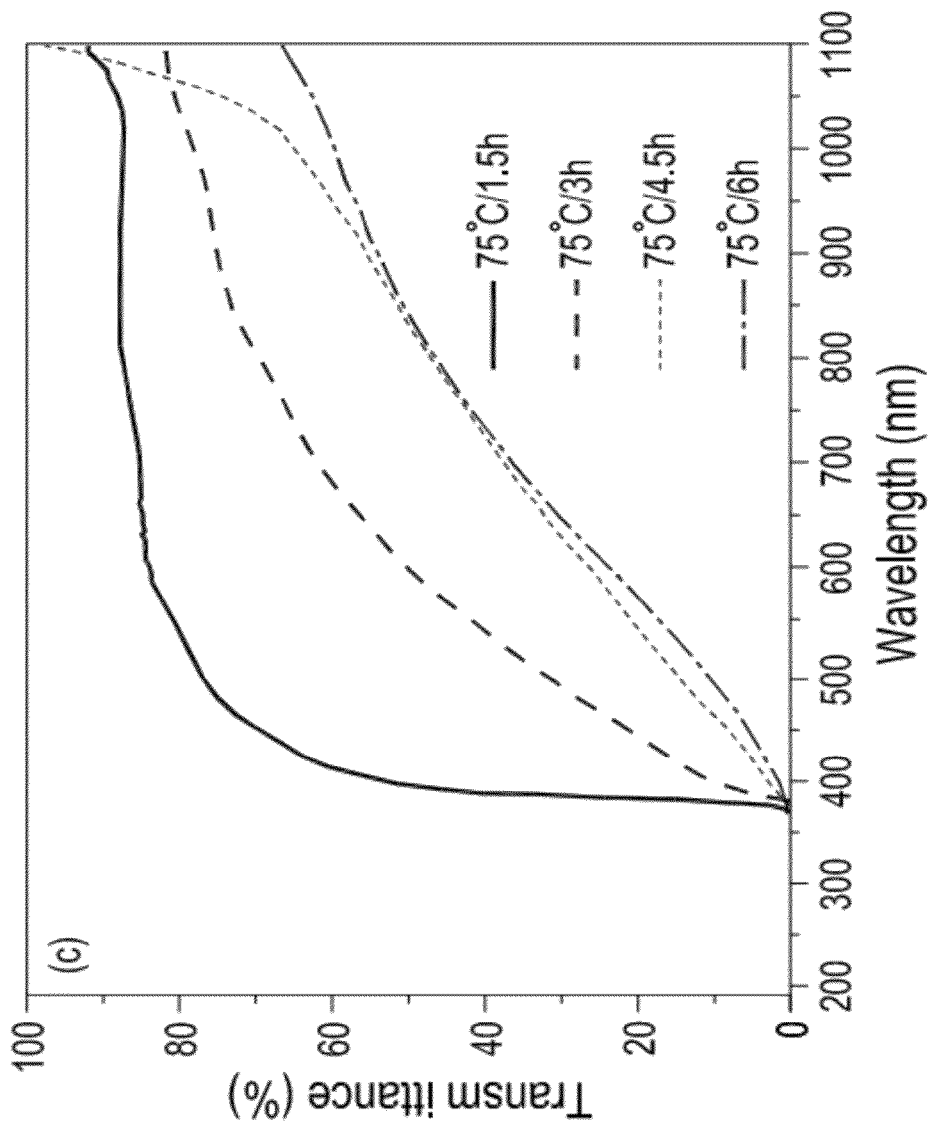
FIG. 24 is a transmittance-versus-wavelength graph of a zinc oxide nanorod thin film in accordance with the present invention made by allowing a zinc oxide seed layer formed from crystals each having a grain size of about 20 nm to grow in a one-step process in a zinc oxide nanorod thin film growing solution having 0.05 M zinc ion at 95° C. for 1.5-6 hours.

With reference to FIGS. 22-24, a zinc oxide nanorod thin film made with a zinc oxide seed layer formed from crystals each having grain size of about 20 nm demonstrates ideal visible light transmittance. With reference to FIG. 22, a zinc oxide nanorod thin film made with a zinc oxide seed layer allowed to grow at 75° C. for 6 hours with a multiple-stepwise process has a transmittance of 85% for visible light.

Figure 25:
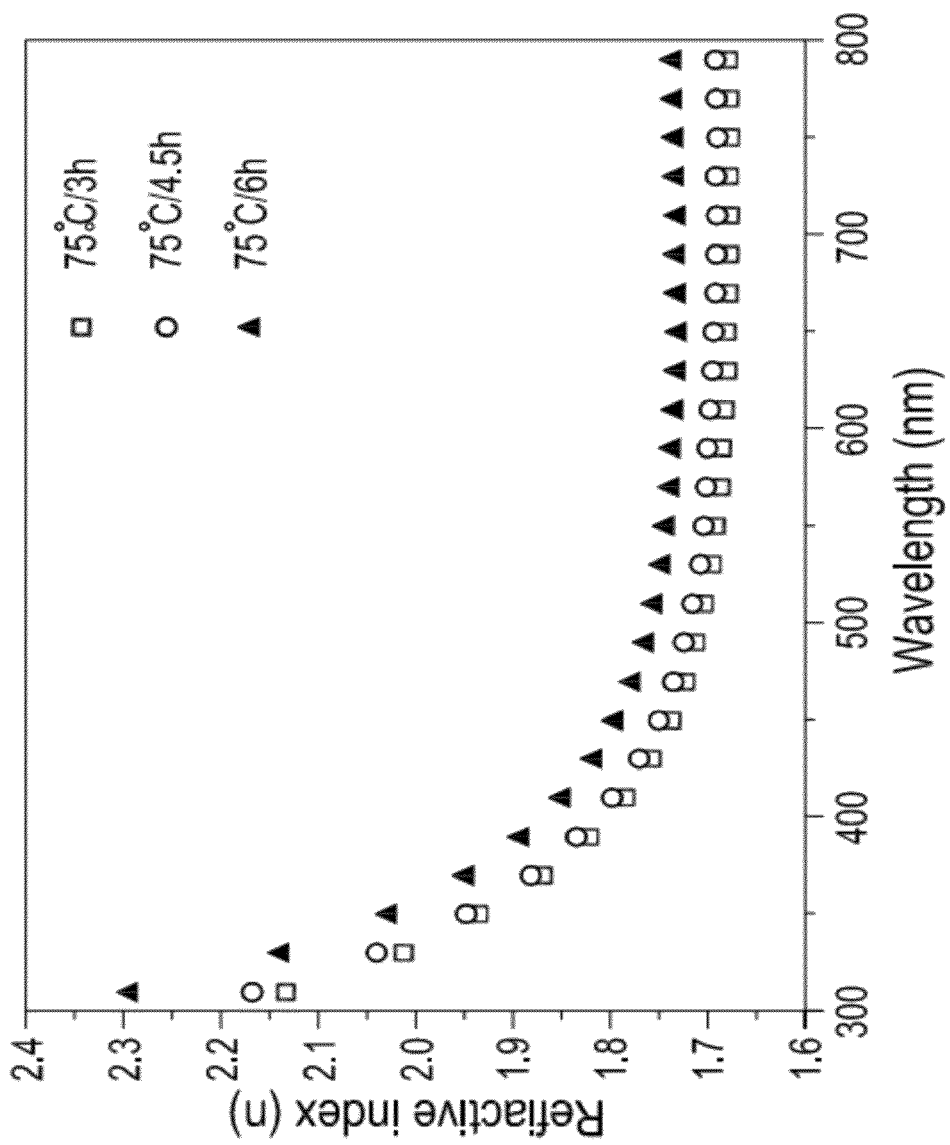
FIG. 25 is a refractive index-versus-wavelength graph of a zinc oxide nanorod thin film in accordance with the present invention made by allowing a zinc oxide seed layer formed from crystals each having a grain size of about 20 nm to grow in a multiple-stepwise process in a zinc oxide nanorod thin film growing solution having 0.05 M zinc ion for various length of time.

With reference to FIG. 25, zinc oxide nanorod thin films made with zinc oxide seed layers allowed to grow at 75° C. for 3, 4.5 or 6 hours with multiple-stepwise processes have refractive index of 1.696, 1.705 and 1.743 at 550 nm. Thus it is clear that a zinc oxide nanorod thin film made with a zinc oxide seed layer allowed to grow at 75° C. for 6 hours is more condensed than zinc oxide nanorod thin films made under conventional conditions.

Figure 26:
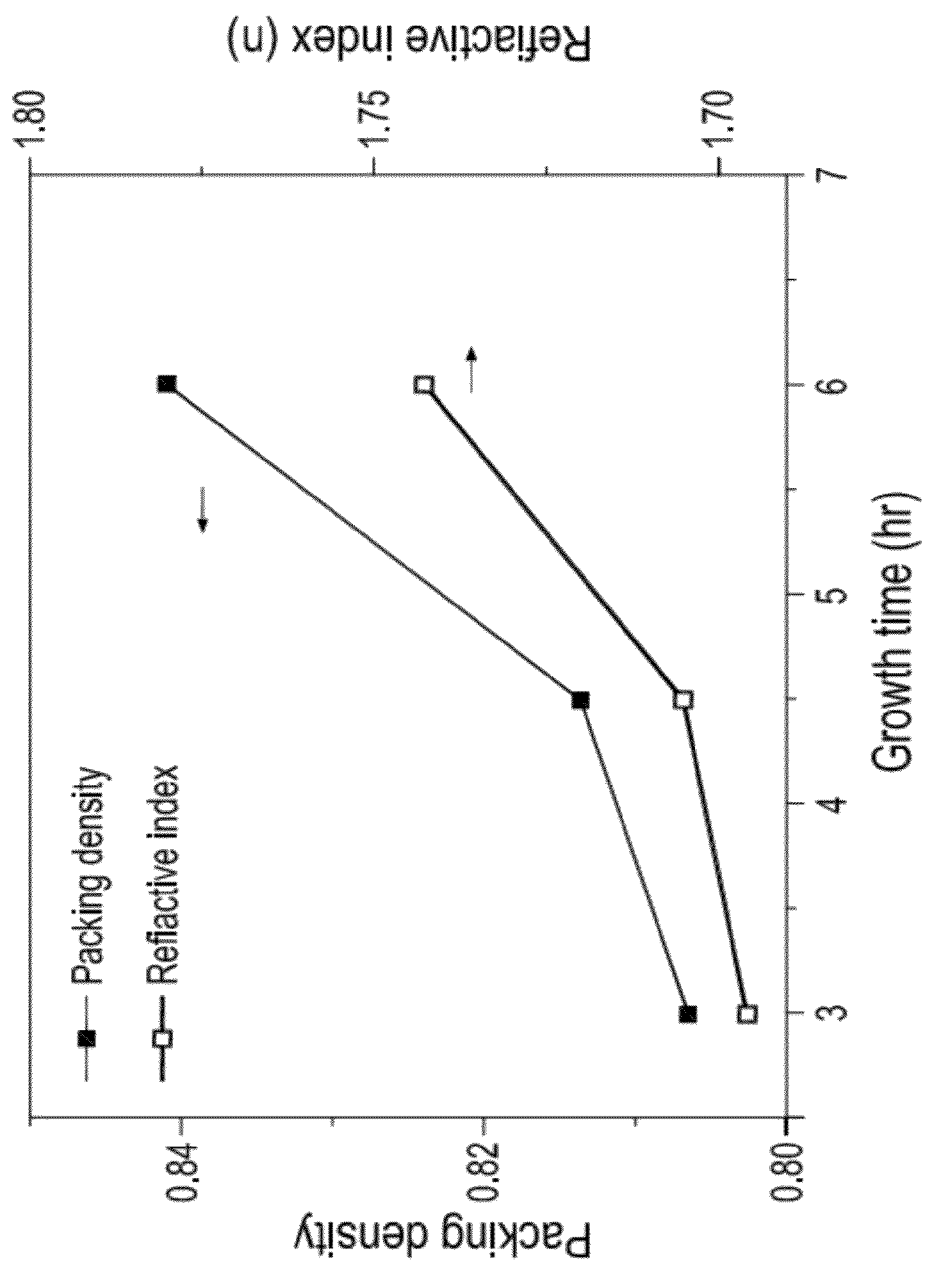
FIG. 26 is a graph indicating the relationship between packing density and refractive index and between refractive index and refractive index of a zinc oxide nanorod thin film in accordance with the present invention made by allowing a zinc oxide seed layer formed from crystals each having a grain size of about 20 nm to grow in a multiple-stepwise process in a zinc oxide nanorod thin film growing solution having 0.05 M zinc ion for various length of time.

With reference to FIG. 26, longer growing time for the zinc oxide seed layer raises packing density and refractive index. A 6 hour growing of the zinc oxide seed layer results in a zinc oxide nanorod that has a refractive index as high as 1.743 and packing density 0.84.

According to the embodiments demonstrated in foregoing Examples and the properties as measured above, it is recognized that the factors for making a highly condensed zinc oxide nanorod thin film are:
- crystal grain size of the zinc oxide seed layer: about 20 nm;
- zinc ion concentration of the zinc oxide nanorod thin film growing solution: 0.05 M;
- growing temperature: 75° C.;
- growing time: 6 hours; and
- allowing the zinc oxide seed layer with multiple-stepwise process.

A zinc oxide nanorod thin film made under the conditions is highly condensed and has the following properties:
- thickness of the nanorods: about 800 nm;
- crystal grain size of the ZnO nanorod: about 200 nm;
- average transmittance for visible light: 85%;
- refractive index: 1.74; and
- packing density: 0.84.

The method in accordance with the present invention is simple and requires no extreme conditions. Also, providing the foregoing conditions is comparatively lower than in the prior art since the method is based on low-temperature solution growth and controls zinc ion concentration and growing time to make highly condensed zinc oxide nanorod thin films with ideal optical properties.

Furthermore, the solutions necessary for the method can be easily made with off shelf chemicals for further cost savings over other physical or chemical methods for making a zinc oxide nanorod thin film.

Thus the present invention is able to provide a zinc oxide thin film that has an average transmittance greater than 85% for visible light and a packing density over 0.84. More specifically, the present invention is able to provide a zinc oxide thin film that has an average transmittance greater than 85% for visible light, a packing density over 0.84 and a refractive index greater than 1.74.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method for making a zinc oxide nanorod thin film comprising
    forming a zinc oxide seed layer comprising multiple crystals each having a grain size of 1-100 nm on a basal plate; and
    preparing a zinc oxide nanorod thin film growing solution in which the zinc oxide seed layer is allowed to grow a zinc oxide crystal columnar layer at a growing temperature ranging from 50 to 100° C. for a growing time ranging from 0.5 to 10 hours to form a zinc oxide nanorod thin film, wherein the zinc oxide nanorod thin film growing solution is a 0.001-0.1 M aqueous zinc ion solution comprising hexamethylenetetramine;
    wherein the zinc oxide seed layer is formed on the basal plate with a sol-gel method; and
    each crystal of the zinc oxide seed layer has a grain size of 5-100 nm; and
    wherein a sol-gel solution for making the zinc oxide seed layer is prepared, wherein the sol-gel solution comprises zinc ion, 2-methoxyethanol and monoethanolamine having a molar ratio of 1:10-40:1;
    the sol-gel solution is applied to the basal plate; and
    the basal plate is soft baked at 100° C. for 10 minutes, sintered at 200° C. for 10 minutes and then annealed at 200-800° C. to form the zinc oxide seed layer.

2. The method as claimed in claim 1, wherein the basal plate on which the zinc oxide seed layer is formed is annealed at 400° C.;
    each crystal of the zinc oxide seed layer has a grain size of about 20 nm;
    the zinc ion concentration of the zinc oxide nanorod thin film growing solution is 0.05 M; and
    the zinc oxide seed layer is allowed to grow into the zinc oxide nanorod thin film in the zinc oxide nanorod thin film growing solution at 75° C. for 6 hours.

3. A method for making a zinc oxide nanorod thin film comprising
    forming a zinc oxide seed layer comprising multiple crystals each having a grain size of 1-100 nm on a basal plate; and
    preparing a zinc oxide nanorod thin film growing solution in which the zinc oxide seed layer is allowed to grow a zinc oxide crystal columnar layer at a growing temperature ranging from 50 to 100° C. for a growing time ranging from 0.5 to 10 hours to form a zinc oxide nanorod thin film, wherein the zinc oxide nanorod thin film growing solution is a 0.001-0.1 M aqueous zinc ion solution comprising hexamethylenetetramine;
    wherein the zinc oxide seed layer is formed on the basal plate with a sputtering method; and
    each crystal of the zinc oxide seed layer has a grain size of 5-100 nm; and
    wherein the sputtering method is practiced under the following conditions:
    oxygen flow rate: 30 sccm;
    argon flow rate: 8 sccm;
    background pressure: $5*10^{-6}$ torr;
    working pressure: 15 mtorr;
    RF power: 150 W;
    basal plate temperature: room temperature; and
    sputtering time: 5 minutes.

4. The method as claimed in claim 3, wherein the basal plate is kept at room temperature; and
    each crystal of the zinc oxide seed layer has a grain size of 5-20 nm.

* * * * *